US006563444B2

(12) United States Patent
Zhang et al.

(10) Patent No.: US 6,563,444 B2
(45) Date of Patent: May 13, 2003

(54) APPARATUS FOR AND METHOD OF PERFORMING A CONVERSION OPERATION

(75) Inventors: Weibiao Zhang, Richardson, TX (US); Marwan Hassoun, Austin, TX (US)

(73) Assignee: Iowa State University Research Foundation, Inc., Ames, IA (US)

( * ) Notice: Subject to any disclaimer, the term of this patent is extended or adjusted under 35 U.S.C. 154(b) by 0 days.

(21) Appl. No.: 09/820,801

(22) Filed: Mar. 30, 2001

(65) Prior Publication Data

US 2002/0171569 A1 Nov. 21, 2002

(51) Int. Cl.⁷ .............................................. H03M 1/10
(52) U.S. Cl. ................. 341/120; 341/118; 341/136; 341/144; 341/153
(58) Field of Search ................ 341/118, 120, 341/136, 144, 153; 395/162–166, 100, 500

(56) References Cited

U.S. PATENT DOCUMENTS

| | | | | |
|---|---|---|---|---|
| 4,399,426 A | * | 8/1983 | Tan ............................ | 341/120 |
| 4,970,514 A | * | 11/1990 | Draxelmayr ................ | 341/120 |
| 4,996,530 A | * | 2/1991 | Hilton ........................ | 341/120 |
| 5,249,266 A | * | 9/1993 | Dye et al. ................... | 395/162 |
| 5,955,980 A | * | 9/1999 | Hanna ........................ | 341/120 |
| 6,130,632 A | * | 10/2000 | Opris ......................... | 341/120 |
| 6,226,562 B1 | * | 5/2001 | Philpott ...................... | 700/117 |
| 6,329,941 B1 | * | 12/2001 | Farooqi ...................... | 341/145 |
| 6,331,830 B1 | * | 12/2001 | Song et al. ................. | 341/121 |

OTHER PUBLICATIONS

Groeneveld, et al., "A Self–Calibration Technique for Monolithic High–Resolution D/A Converters", *IEEE Journal of Solid–State Circuits*, vol. 24, No. 6, Dec. 1989, pp. 1517–1522.

Maio, et al., "An Untrimmed D/A Converter with 14–Bit Resolution", *IEEE Journal of Solid–State Circuits*, vol. SC–16, No. 6, Dec. 1981, pp. 616–620.

Redfern et al., "A Monolithic Charge–Balancing Successive Approximation A/D Technique", *IEEE Journal of Solid–State Circuits*, vol. SC–14, No. 6, Dec. 1979, pp. 912–920.

* cited by examiner

*Primary Examiner*—Michael Tokar
*Assistant Examiner*—Linh V Nguyen
(74) *Attorney, Agent, or Firm*—Dickstein Shapiro Morin & Oshinsky LLP (57) ABSTRACT

In accordance with a preferred embodiment, a self-calibrated cell (and corresponding operation) is provided that receives a reference parameter (e.g., current, voltage, etc.) for storage in the cell and for supplying to a load. The individual cell is controlled to operate in different states or modes: either a redundant mode or a supplying mode. In the redundant mode, the reference parameter is stored in the current cell during a calibration phase or mode, and the stored reference parameter is dumped or otherwise transferred, preferably to ground, during a dumping state or mode. In the supplying mode, the current cell transfers or supplies the stored reference parameter to the load. The individual cell is controlled to operate in its dumping state both before the cell enters the calibration mode and also at the same time that the cell is switched from the calibration mode to the supplying mode. In accordance with a preferred embodiment, the individual cells may be employed in a cell array of a converter (e.g., digital-to-analog converter). All of the cells in the array may individually be placed in a redundant mode in succession, while the remaining cells are in a supplying mode.

9 Claims, 7 Drawing Sheets

APPARATUS FOR AND METHOD OF PERFORMING A CONVERSION OPERATION

BACKGROUND

With the development of communication techniques, digital signal processing, and computer networking, the requirements of interfacing between analog and digital domains is increasing dramatically. High-speed, high-accuracy digital-to-analog converter (DAC) or analog-to-digital converters (ADC) are in great demand.

In DAC design, current mode converters are popular for use with video frequency or higher applications. Current-steering DACs are based on current cells arranged by binary weighted or thermometer code. Matching is critical for obtaining high accuracy. Many available CMOS digital processes are difficult if not impossible to achieve more than 10-bit matching accuracy. In order to achieve high accuracy, various calibration techniques have to be applied.

As described in Redfern et al., "A Monolithic Charge-Balancing Successive Approximation A/D Technique," IEEE JSSC, Vol. SC-14, No. 6, pp. 912–920 (December 1979), which is incorporated herein by reference, one early calibration method utilized was laser trimming of thin film resistors. Accurate resistor values and exact matching can be achieved. The laser trimming, however, can cause thermal and mechanical stress, and the trimmed parts are sensitive to temperature and aging effects.

Techniques developed that allowed the conversion operation to calibrate itself (known as "self-calibration") emerged as an alternative to laser trimming. One such technique, non-continuous self-calibration (also known as "self-compensation"), is a calibration procedure used in conversion systems and operations that are not continuously in use. A typical implementation of a non-continuous self-calibration technique is described in detail in Maio et al., "An Untrimmed D/A Converter with 14-bit Resolution," IEEE Journal of Solid-State Circuits, Vol. 16, pp. 616–621 (December 1981), which is incorporated herein by reference. As part of the calibration phase, an accurate (reference) ramp signal is generated and the DAC output is compared to the reference ramp signal. The difference between the DAC output and the ideal output is detected during the calibration phase and used to compensate the DAC output issued during an actual conversion operation.

Figure 7:
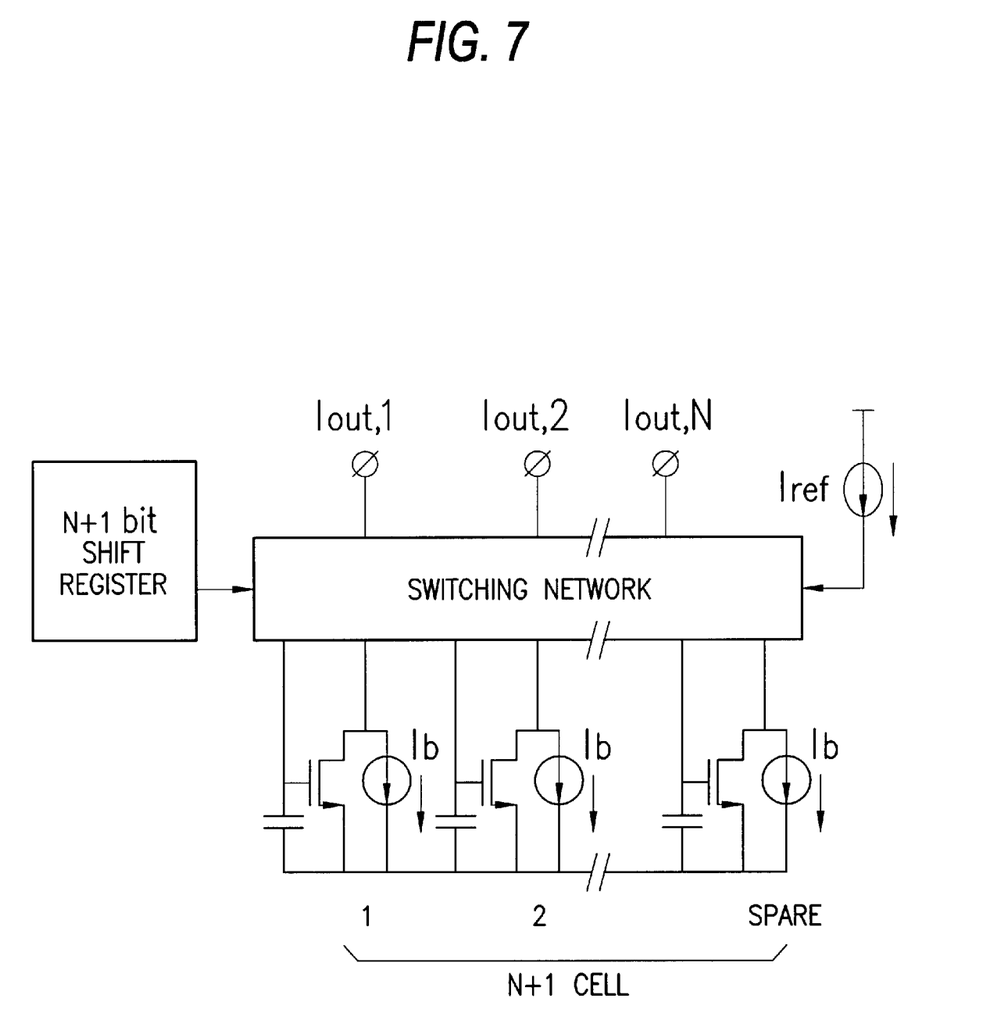
FIG. 7 is a block diagram illustrating a known continuous self-calibration technique.

Continuous self-calibration is more efficient in that the overall conversion operation is continually performed without interruption by the calibration procedure. A typical implementation of a known continuous self-calibration technique in a current steering DAC based on dynamic element matching is illustrated in FIG. 7. As illustrated in FIG. 7, an N+1 shift register and N+1 current sources are provided for an n-bit conversion operation. One of the N+1 current sources is utilized as a spare source, as only N sources are needed to perform the conversion operation. At any given time, only one of the registers in the N+1 shift register has a value of "1," the remaining registers having a value of "0." Because the N+1 shift register selects the current source (or cell) to be calibrated, only one current cell is calibrated at a given time. Each current cell is individually calibrated to a reference current. When a selected cell is being calibrated, the "spare" source effectively replaces the selected cell in the conversion operation and supplies output current in its place. A switching network is provided to perform the necessary switching functions needed to accomplish the calibration and conversion operations simultaneously.

The continuous self-calibration technique is commonly implemented in CMOS technology. Matching is not a major concern due to the dynamic element matching principle utilized in the calibration procedure. Signal glitching is evident during switching from a calibration mode to an output mode of the calibrated cells. Such signal glitching, however, can be ignored if the energy is less than ½ the least significant bit (LSB), as is the case in audio frequency applications where settling time is long enough. In high-speed applications (e.g., hundreds of MHz required in wireless personal communications, video signal processing, GHz LAN applications, etc.), however, the settling time (e.g., 1/Frequency of signal (Fs)) for the converted analog signal is short and the need for accuracy (e.g., more than 10-bit accuracy) is greater. In such applications, the signal glitches cannot only be higher than ½ LSB energy, but also cause unsettled results, leading to distortion. As a result, periodic errors with a frequency of the calibration clock exist that causes increased noise floor and deterioration of spurious free dynamic range (SFDR) of the converter. An illustration of a typical signal glitch occurring in known conversion operations is shown in the encircled portion 60 of FIG. 6.

SUMMARY

In accordance with a preferred embodiment, a self-calibrated cell (and corresponding operation) is provided that receives a reference parameter (e.g., current, voltage, etc.) for storage in the cell and for supplying to a load. The individual cell is controlled to operate in different states or modes: either a redundant mode or a supplying mode. In the redundant mode, the reference parameter is stored in the current cell during a calibration phase or mode, and the stored reference parameter is dumped or otherwise transferred, preferably to ground, during a dumping state or mode. In the supplying mode, the current cell transfers or supplies the stored reference parameter to the load. The individual cell is controlled to operate in its dumping state both before the cell enters the calibration mode and also at the same time that the cell is switched from the calibration mode to the supplying mode. In accordance with a preferred embodiment, the individual cells may be employed in a cell array of a converter (e.g., digital-to-analog converter). All of the cells in the array may individually be placed in a redundant mode in succession, while the remaining cells are in a supplying mode.

BRIEF DESCRIPTION OF THE DRAWINGS

Many advantages, features, and applications of the invention will be apparent from the following detailed description of preferred embodiments of the invention, which is provided in connection with the accompanying drawings, in which.

DETAILED DESCRIPTION

Preferred embodiments in application of the invention will now be described with reference to FIGS. 1–5. Other embodiments may be realized and structural or logical changes may be made to the disclosed embodiments without departing from the spirit or scope of the invention. Although the embodiments are particularly described as applied to a self-calibrated current cell architecture used in a digital-to-analog conversion operation, it should be readily apparent that the invention may be embodied in any similar architecture (or operation) or any architecture (or operation) having the same or similar problems.

Figure 1:
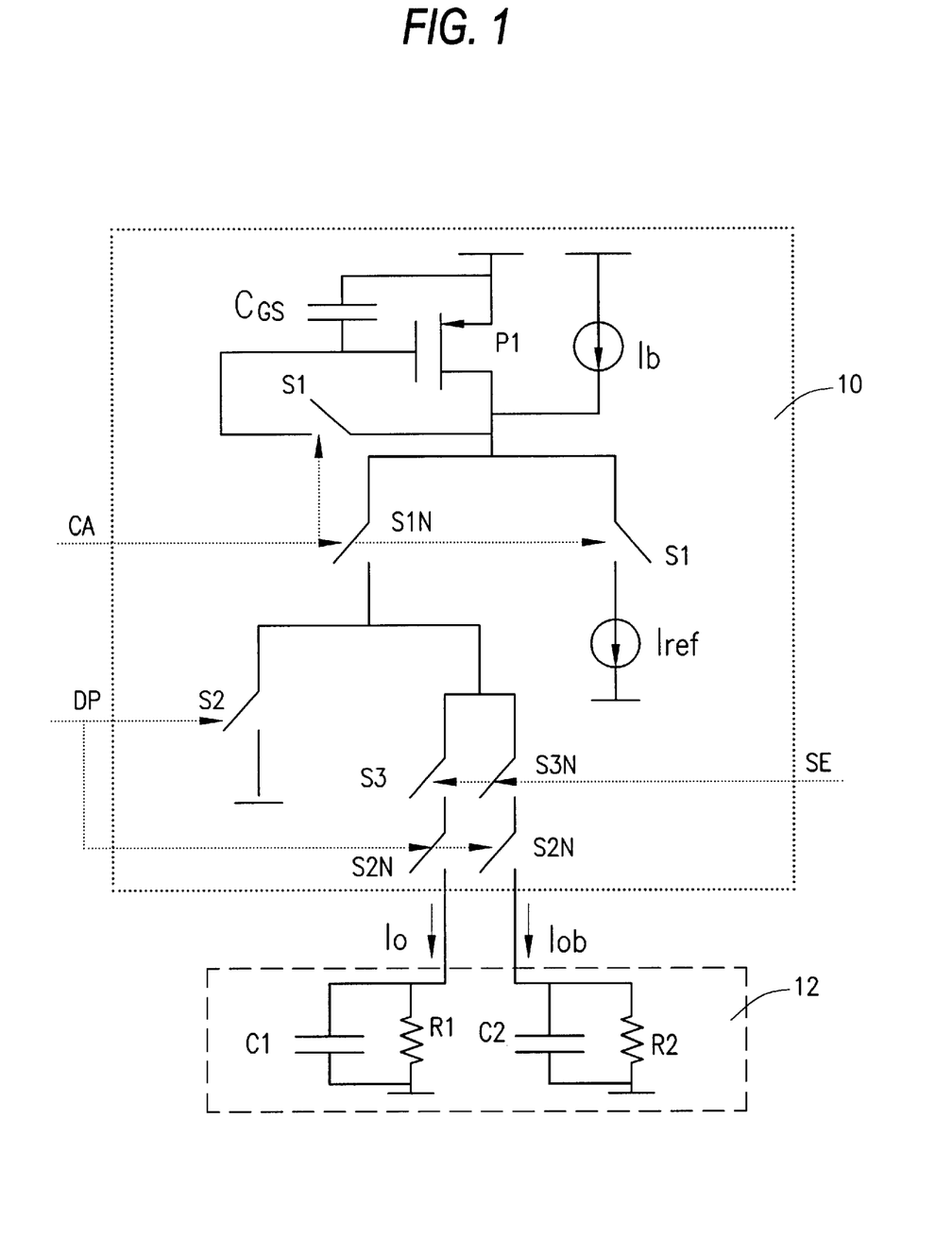
FIG. 1 illustrates a current cell in accordance with a preferred embodiment of the invention.

In accordance with a preferred embodiment of the invention, an individual cell is provided, as exemplified in FIG. 1, as one of a plurality cells in a cell array to be used in a conversion operation. For the purposes of illustration of this embodiment, the individual cell takes the form of a self-calibrated current cell 10 supplying current Io (and Iob) to output load 12 (symbolically represented by resistor-capacitor (RC) circuit components C1, R1, C2, and R2). Current cell 10, as illustrated, stores a reference parameter in the exemplary form of a reference current in a storage element (symbolically represented as capacitor Cgs). A current source (symbolically illustrated as current source Iref) selectively provides the reference current to capacitor Cgs of current cell 10 depending on the operational state of cell 10. In the calibration state or mode, the reference current output of reference current source Iref is applied to transistor P1, together with a bias current output from bias current source Ib to cause a charge to be stored in capacitor Cgs due to the combined output current flow through transistor P1. Symbolic switches S1 and (complement switch S1N) operate to selectively apply the reference current output from reference current source Iref to transistor P1.

Switches S1 (and complement switch S1N) are operated by calibration control signal CA input to current cell 10 from an external device (not shown in FIG. 1). Application of control signal CA to current cell 10 during the calibration mode activates switches S1 (and deactivates complement switch S1N) to effectuate application of the reference current output to transistor P1, and thus, the storage of a charge (reference current) in capacitor Cgs. The removal or release of control signal CA deactivates switches S1 to effectively prevent the reference current output from reaching transistor P1. The release of control signal CA, however, activates complement switch S1N to allow the charge or current stored in capacitor Cgs to be transferred.

In the dumping state or mode, dumping control signal DP is applied to current cell 10 from an external device (not shown in FIG. 1). Based on application of dumping control signal DP, switch S2 is activated and complement switches S2N are deactivated. If, at this time, the calibration control signal CA has been released, complement switch S1N has been activated to permit transfer or dumping of the stored current from capacitor Cgs through switch S2, preferably to ground. When current cell 10 is taken out of the dumping state, dumping control signal DP is released to cause the activation of complement switches S2N and the deactivation of switch S2. Assuming complement switch S1N has not been deactivated, the stored current in capacitor Cgs is then steered to output load 12. In this illustrated embodiment, the stored current is steered into either output current Io or Iob based on selection control signal SE, which is input to current cell 10 by an external device (not shown in FIG. 1). Application of selection control signal SE, for example, activates switch S3 and deactivates complement switch S3N. As a result, the reference current stored in capacitor Cgs will appear to output load 12 as output current Io (assuming switch S1N remains activated). Release or removal of selection control signal SE will deactivate switch S3 and activate complement switch S3N, resulting in the steering of the reference current to output load 12 as output current Iob (assuming switch S1N remains activated).

Figure 2:
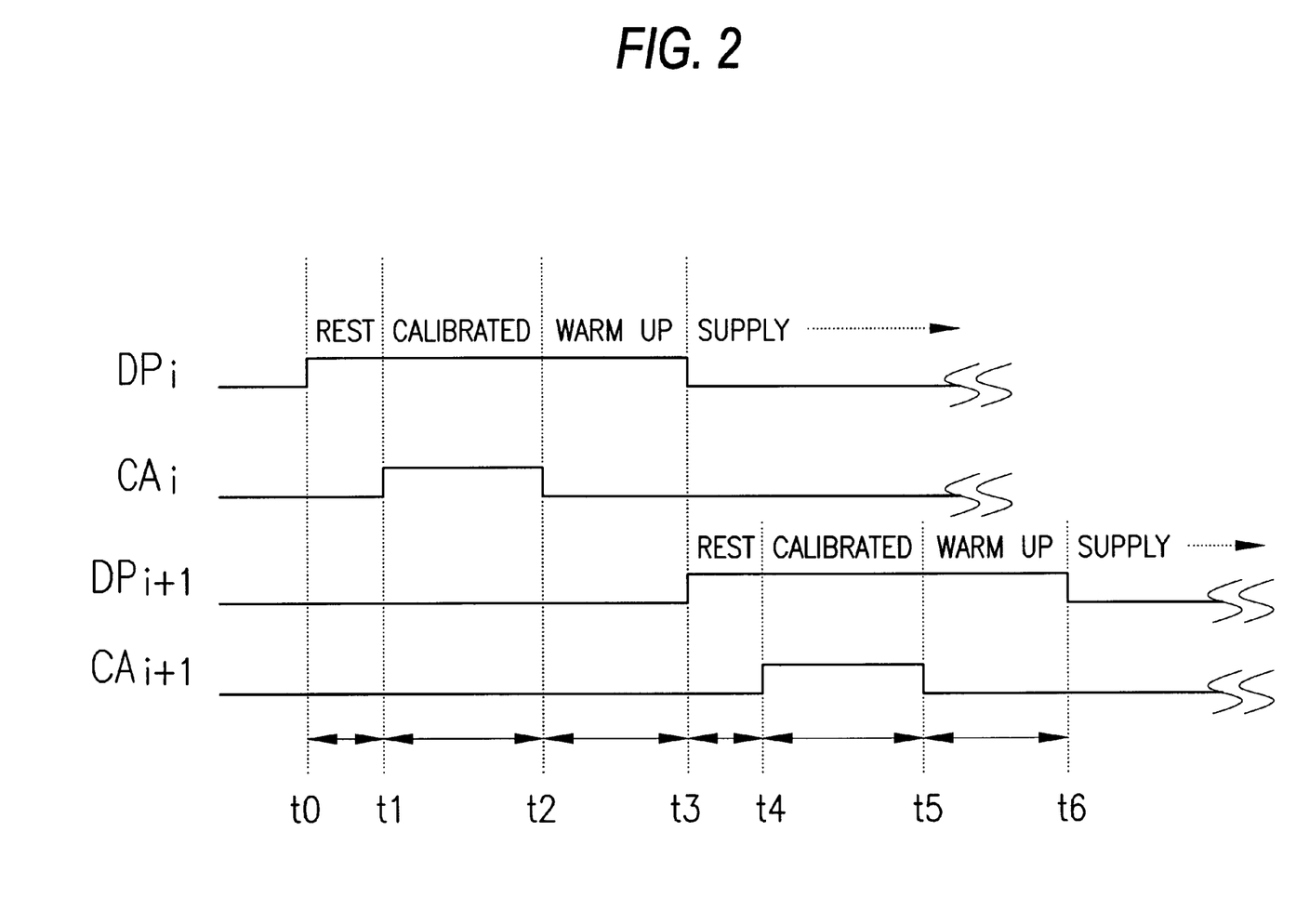
FIG. 2 is a timing diagram illustrating the operation of two cells in accordance with a preferred embodiment of the invention.

In accordance with a preferred embodiment of the invention, current cell 10 (or any other cell structure) may be controlled by two control signals (e.g., calibration control signal CA and dumping control signal DP) to operate in its various states or modes (e.g., calibration state, dumping state, supplying state). As illustrated in FIG. 2, a cells may be placed in a dumping state by application of dumping control signal $DP_1$ for an initial ("rest") period between time t0 and time t1, at which time calibration control signal $CA_1$ is not applied to $cell_1$. (For current cell 10, as illustrated in FIG. 1, the dumping state involves the transfer or dumping of stored reference current, preferably to ground.)

Between time t1 and time t2, a transition ("calibrated") period is initiated through the application of calibration control signal $CA_1$ to $cell_1$, placing $cell_1$ in a calibration state. In accordance with this illustrated embodiment of the invention, dumping control signal $DP_1$ continues to be applied to cells through this ("calibrated") period. (For current cell 10, the calibration state involves the storage of reference current in capacitor Cgs.) Release or removal of calibration control signal $CA_1$ occurs during a ("warm up") period between time t2 and time t3, in which dumping control signal $DP_1$ continues to be applied to $cell_1$, thus, reverting $cell_1$ back to the dumping state. (For current cell 10, the calibration state terminates, and the stored reference current is again transferred or dumped, preferably, to ground in the dumping state.) Beginning at time t3, dumping control signal $DP_1$ is removed, which, together with no application of calibration control signal $CA_1$, is effective to place $cell_1$ in a supplying state. (For current cell 10, the stored reference current is steered to output load 12 in the supplying state.) Among the many advantages apparent from (or inherent in) the preferred embodiment, the cell is allowed to "warm up" prior to supplying its output in the conversion operation. The "warm-up" time period can be designed long enough for the cell to "practice" the output function by dumping the current (e.g., to ground).

Any cell array constructed to include a plurality of cells necessary to perform a desired conversion (e.g., digital-to-analog) operation may, in accordance with a preferred embodiment of the invention, incorporate two control signals (e.g., calibration control signal $CA_1$, dumping control signal $DP_1$) to effectuate control of individual cells ($cell_1$) through its various operating states (e.g., calibration, dumping, supplying, etc.). Individual ones of the plurality of cells may be operated to transition between a "redundant" mode (involving the "rest," "calibrated," and "warm up" states depicted in FIG. 2) and a "supplying" mode (involving the "supplying" state depicted in FIG. 2).

In accordance with a preferred embodiment, the plurality of cells in the cell array transition through the phases successively or sequentially such that only one cell at a time of the cell array is in the redundant mode. Preferably, the remaining cells of the array are in the "supplying" mode so as to effectuate the conversion operation in a continuous manner. Thus, for example, in performing an n-bit conversion operation (e.g., conversion of digital input signals into analog output signals), N+1 cells are provided (where the number N+1 is equal to 2 to the nth power (N+1=2")) and at any given time N cells are in a "supplying" mode to function in the conversion operation. At this same given time, the remaining cell is dynamically assigned to be in a "redundant" mode, in which it transitions between "rest," "calibrated," and "warm up" phases, as described above.

The "relay"-like successive transition between individual cells in a cell array is exemplified in FIG. 2 by illustrating the transitions between states of two cells (e.g., $cell_i$ and $cell_{i+1}$) relative to each other in a given cell array. As described above, $cell_i$ operates through "rest," "calibrated," and "warm up" phases in a "redundant" mode between time t0 and time t3 based on the application of the dumping control signal $DP_i$ and calibration control signal $CA_i$. At all other times (i.e., time t3+ until repeating cycle beginning with time t0) $cell_i$ is in the "supplying" mode providing output for a conversion operation. As $cell_i$ is in the "redundant" mode between time t0 and time t3, $cell_{i+1}$ (as well as the other cells of the cell array) is in a "supplying" mode. After $cell_i$ switches to the "supplying" mode, $cell_{i+1}$ (or any other individual cell in the array) enters a "redundant" mode in the period between time t3 and time t6. $Cell_{i+1}$ transitions through "rest," "calibrated," and "warm up" phases based on the application of the dumping control signal $DP_{i+1}$ and calibration control signal $CA_{i+1}$ in the same manner as cell1, as described above. In accordance with a preferred embodiment of the invention, subsequent time periods (e.g., time t6 to t9, time t9 to t12, . . . time tn−3 to tn) would be implemented similarly for each of the individual cells of the cell array to allow a dynamic assignment of the "redundant" mode to each of the cells in the cell array.

Figure 3:
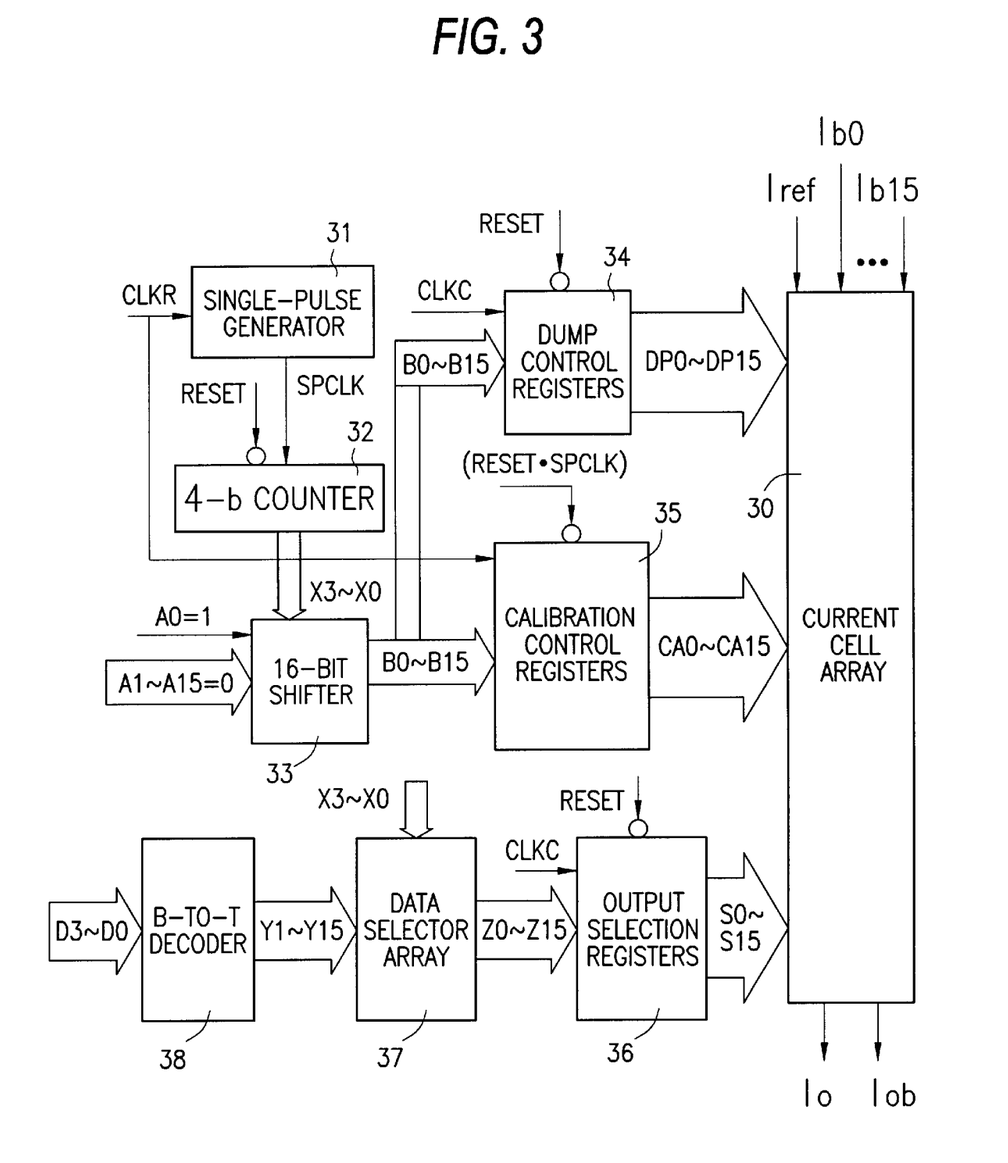
FIG. 3 is a block diagram depicting a 4-bit digital-to-analog converter in accordance with a preferred embodiment of the invention.

To further illustrate the applications and implementations of the invention, a preferred embodiment of the invention is depicted in FIG. 3 as one implementation in a continuous, self-calibrated 4-bit digital-to-analog converter. As shown, a current cell array 30 is provided having 16 (N=15) self-calibrated current cells to perform a 4-bit digital-to-analog conversion operation. (For simplicity, each current cell in cell array 30 is assumed to utilize the cell architecture depicted in FIG. 1, with respective current outputs Io and Iob tied together to produce single current outputs Io, Iob of cell array 30.) A single-pulse generator 31, 4-bit counter 32, 16-bit shifter 33, and data selector array 37 work together to control the self-calibration and output synchronization of the converter. Single-pulse generator 31 is provided, for example, to generate a single pulse signal (SPCLK) in response to calibration clock signal CLKR. The SPCLK output is applied to 4-bit counter 32 to effect an increment in the count stored in 4-bit counter 32. The stored count is output (X3~X0) from 4-bit counter 32 and applied to both 16-bit shifter 33 and also data selector array 37 so as to control which cell of cell array 30 is to enter a "redundant" mode.

As illustrated, with only one input bit equal to "1," the shifted-by-M (i.e., M is equal to the decimal value of X3~X0) version of input address signals A0~A15, B0~B15, are output from 16-bit shifter 33 and fed to dump control registers 34 and calibration control registers 35. In response to address signals B0~B15, dump control registers 34 issue output signals DP0~DP15, and calibration control registers 35 output signals CA0~CA15. In this illustrated embodiment, the position of the "1" in output signals DP0~DP15 and CA0~CA15 determine which cell will enter the redundant mode. Output count X3~X0 will also control data selector array 37 to select the cells in the supplying mode.

A binary-to-thermometer decoder may be added, as shown by B-to-T decoder 38 illustrated in FIG. 3, in this particular embodiment. One of the many advantages of using B-to-T decoder 38 is to facilitate reduction in signal glitches caused by changes in the digital input data (D3~D0) in the most significant bit (MSB) (e.g., 0111 to 1000). Output signals Y1~Y15 from decoder 38 are input to data selector array 37. Based on output signals X3~X0 from 4-bit counter 32 and output signals Y1~Y15 from decoder 38, data selector array 37 outputs code signals Z0~Z15 to ensure that the N cells of cell array 30 that are in "supplying" mode are properly selected. Output code signals Z0~Z15 are stored in output selection registers 36 and synchronized for output with conversion clock CLKC as output selection control signals S0~S15.

Figure 4:
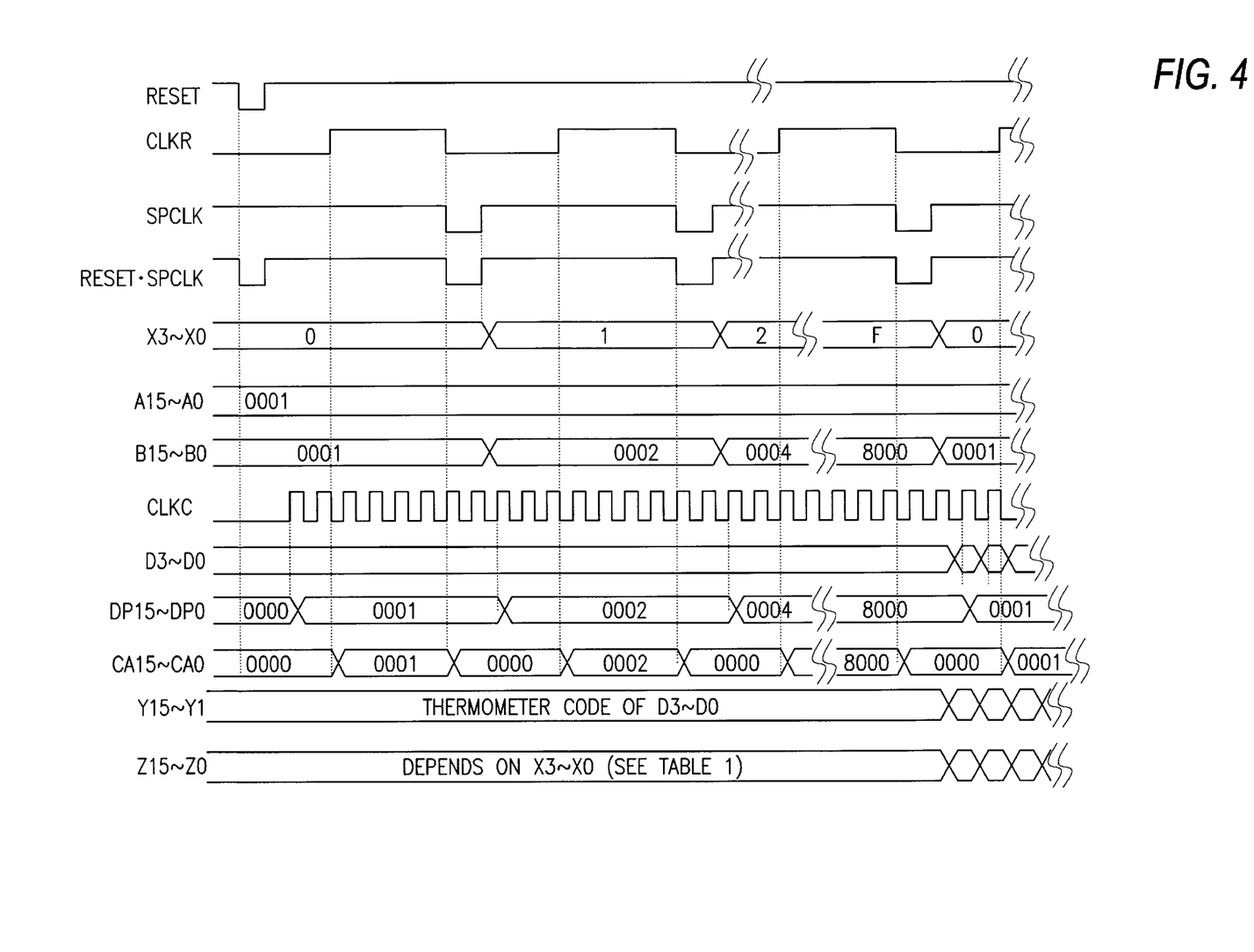
FIG. 4 is a timing diagram for the converter depicted in FIG. 3.

The timing diagram presented in FIG. 4 illustrates the relative operation of the different components making up the exemplary digital-to-analog converter depicted in FIG. 3. An external reset signal is input to the converter to clear various components such as 4-bit counter 32, dump control registers 34, calibration control registers 35, and output selection registers 36. External clock signals such as conversion clock CLKC and calibration clock CLKR are applied to the converter. At this time, the first current cell of cell array 30 enters the "redundant" mode. The single-pulse generator 31 generates its output signal SPCLK to trigger 4-bit counter 32 to increment its stored count by 1 and output counter signals X3~X0. The new counter output signals X3~X0 cause a change in 16-bit shifter output B0~B15. As a result, the next current cell enters into the "redundant" mode for calibration. Once all of the 16 cells in the cell array 30 have been in the "redundant" mode at least once, the input data can be converted.

The 4-bit counter 32 output signals X3~X0 synchronize the calibration with the conversion by making the right selection of current cells in the "supplying" mode. This function may be facilitated, for example, by operation of the data selector array 37 in accordance with the following function table:

TABLE 1

Data Selector Array Function Table

X3~X0   Z15~Z0

0   $Z_i = Y_i$, when i = 1, 2, . . .15; Z0 = x (where "x" is "don't care" condition)
1   $Z_i = Y_1$, when i = 2,3,. . .15. Z1 = x, Z0 = Y1
2   $Z_i = Y_i$, when i = 3, 4,. . .15, Z2 = x, Z1 = Y2, Z0 = Y1
3   $Z_i = Y_i$, when i = 4, 5,. . .15, Z3 = x, $Z_j = Y_j + 1$ when j = 0, 1, 2
4   $Z_i = Y_i$, when i = 5, 6,. . .15, Z4 = x, $Z_j = Y_j + 1$, when j = 0, 1, . . .3.
5   $Z_i = Y_i$, when i = 6, 7,. . .15, Z5 = x, $Z_j = Y_i + 1$, when j = 0, 1. . . .4.
6   $Z_i = Y_i$, when i = 7, 8,. . .15, Z6 = x, $Z_j = Y_j + 1$, when j = 0, 1,. . .5.
7   $Z_i = Y_i$, when i = 8, 9,. . .15, Z7 = x, $Z_j = Y_j + 1$, when j = 0, 1,. . .6.
8   $Z_i = Y_i$, when i = 9, 10,. . .15, Z8 = x, $Z_j = Y_j + 1$, when j = 0, 1,. . .7.
9   $Z_i = Y_i$, when i = 10, 11,. . .15, Z9 = x, $Z_j = Y_j + 1$, when j = 0, 1,. . .8.
10  $Z_i = Y_i$, when i = 11, 12,. . .15, Z10 = x, $Z_j = Y_j + 1$, when j = 0, 1, . . .9.
11  $Z_i = Y_i$, when i = 12, 13,. . .15, Z11 = x, $Z_j = Y_j + 1$, when j = 0, 1,. . .10.
12  $Z_i = Y_i$, when i = 13, 14, 15, Z12 = x, $Z_j = Y_j + 1$, when j = 0, 1,. . .11.

TABLE 1-continued

Data Selector Array Function Table

| X3~X0 | Z15~Z0 |
|---|---|
| 13 | Zi = Yi, when i = 14, 15, Z13 = x, Zj = Yj + 1, when j = 0, 1,. . .12. |
| 14 | Z15 = Y15, Z14 = x, Zj = Yj + 1, when j = 0, 1,. . .13. |
| 15 | Z15 = x, Zj = Yj + 1, when j = 0, 1,. . .14. |

Figure 5:
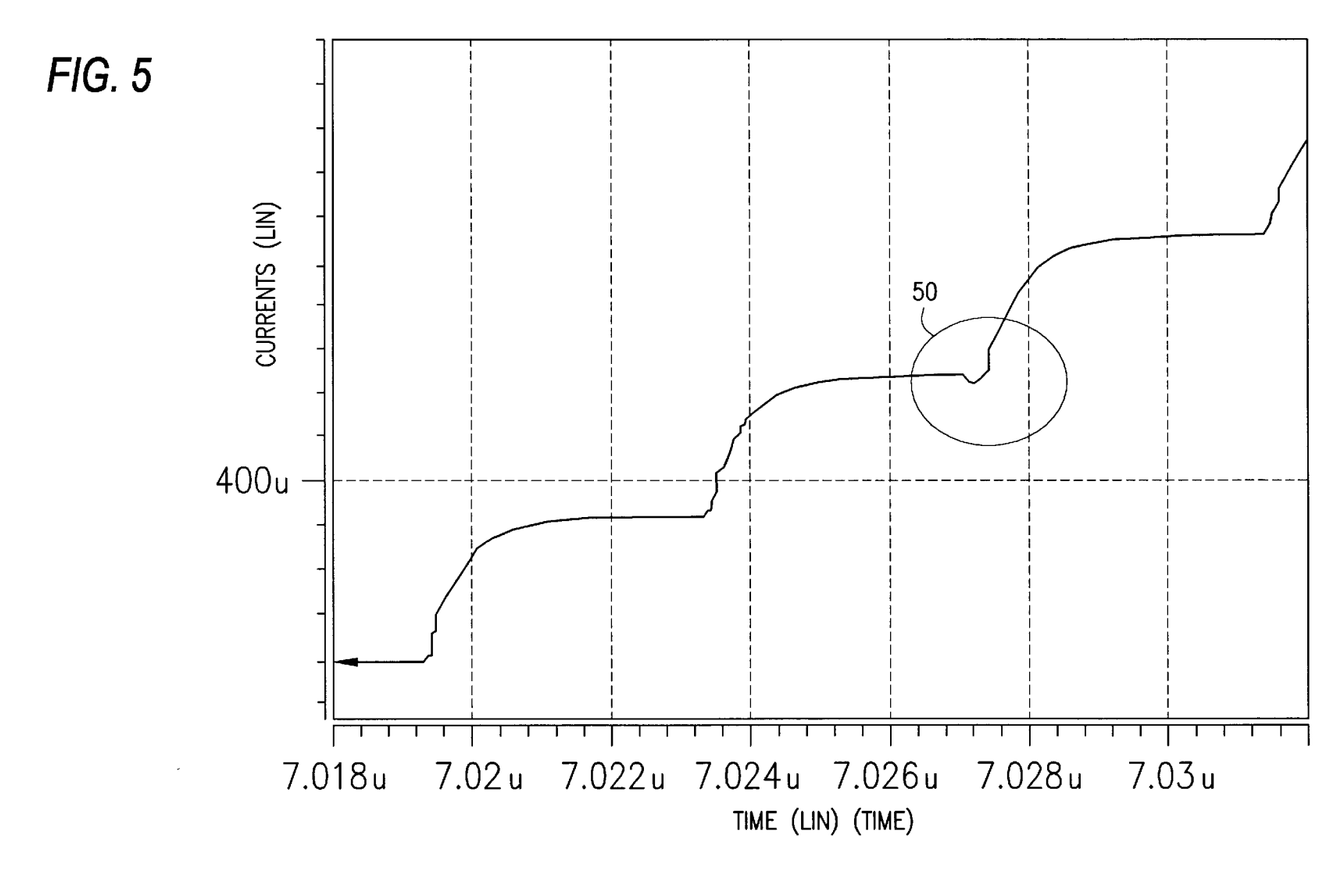
FIG. 5 is an exemplary analog waveform output from a conversion operation in accordance with a preferred embodiment of the invention.
Figure 6:
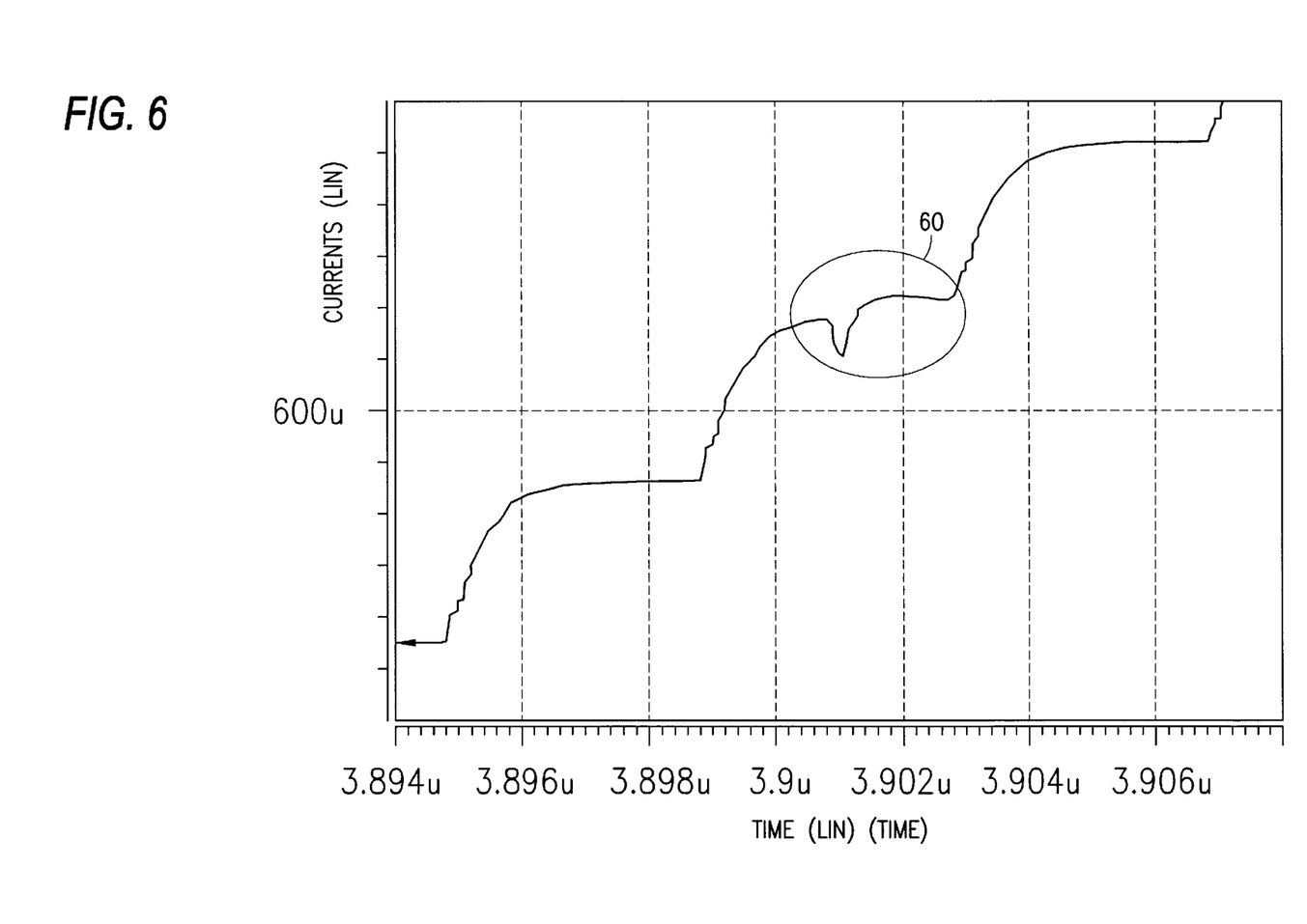
FIG. 6 is an exemplary analog waveform output from a known conversion operation.

One of the many advantages of the embodiments described herein lies in the ability to minimize (or eliminate) switching glitches found in conventional conversion operations when used in continuous, self-calibration converters. As shown in FIG. 6, for example, a conventional digital-to-analog conversion of a digital ramp signal into a staircase signal is illustrated using continuous self-calibration. An encircled portion 60 of the output signal highlights signal glitches occurring when the conversion operation switches from a calibration mode to a supplying mode. In comparison, a digital-to-analog conversion utilizing a preferred embodiment of the invention, as described herein, shows an output signal having signal glitches (encircled portion 50) with less than 1/10 of the energy of the conventional operation. Moreover, the conversion operation utilizing a preferred embodiment allows the output signal to settle to an expected value despite the presence of the signal glitches. The conventional conversion output waveform, however, cannot settle to an expected value with the signal glitches, as the residue value becomes a source of distortion and worse spurious free dynamic range (SFDR).

While preferred embodiments of the invention have been described and illustrated, it should be apparent that many modifications (e.g., structural, logical, etc.) to the embodiments and implementations of the invention can be made without departing from the spirit or scope of the invention. For example, while the exemplary embodiments disclosed herein depict the use of current cells particularly in a digital-to-analog conversion operation, the invention can easily be implemented with any other equivalent element used in a digital-to-analog conversion operation of any bit length. Moreover, the invention may also be embodied to perform conversion operations (e.g., analog-to-digital, non-continuous, etc.) other than those specifically described herein. Although the invention may be readily applied to embodiments in high-speed communication circuits (wired/wireless), video products, and mixed-signal circuits, the invention may easily be applied to any conversion operation or other application (e.g., audio frequency applications, etc.) utilizing conversion operations.

The symbolic elements (e.g., switches S1, S2, transistor P1) depicted in FIG. 1 may be implemented with any known components (e.g., MOSFET transistors, programmable logic arrays, etc.) in any arrangement to individually perform the functions represented by the symbolic elements or to perform several (or all) of the functions represented. The storage element represented by capacitor Cgs may be a parasitic capacitor, passive capacitor, active capacitor, or any other known storage element (including non-capacitor-based elements). Although the cell array 30 illustrated in FIG. 3 was assumed to include the cell architecture depicted in FIG. 1, any similar, equivalent, or other cell construction (or combinations of individual cell constructions) may be utilized as apparent to those of ordinary skill in the art that functions in cell array 30 in the manner described herein. For example, a cell array may contain any number of different cell architectures for individual cells making up the array. Where unequal current cells are used, more than one reference current may be required, and a different redundant cell may be needed for each group of equal weight.

Although the exemplary embodiments have been described with respect to only a single cell of a given array being placed in a "redundant" mode during a conversion operation, embodiments may be implemented to permit any number of cells to be placed in the "redundant" mode at any given time. Preferably, under such circumstances, the number of cells in the "supplying" mode for the given cell array so implemented would remain sufficient to function properly in the conversion operation.

The references to control signals (e.g., calibration control signal CA, dumping control signal DP, etc.) are for illustrative purposes only. Any known signaling parameters (e.g., voltage, current, etc.) may be utilized in implementing the invention.

The modules described herein, particularly those illustrated in (or inherent from) FIGS. 1–4, may be one or more components in various combinations. Although the modules are shown or described as physically separated components (e.g., single-pulse generator 31, 4-bit counter 32, FIG. 3), it should be readily apparent that individual modules may be omitted, combined, or further separated into a variety of different components, sharing different elements as required for the particular implementation of the embodiments disclosed herein. Accordingly, the invention is not limited by the description or drawings of this disclosure, but only by the appended claims.

What is claimed as new and desired to be protected by Letters Patent of the United States is:

1. A digital-to-analog converter comprising:
   a single-pulse generator, wherein said single-pulse generator periodically issues single pulses;
   a bit counter, coupled to said single-pulse generator, wherein said bit counter increments a stored count in response to single pulses received from said single-pulse generator;
   a bit shifter, coupled to said bit counter, wherein said bit shifter contains a plurality of shift registers shifting their respective contents based on the stored count received from said bit counter;
   a dump control register module, coupled to said bit shifter, containing a plurality of dump control registers;
   a calibration control register module, coupled to said bit shifter, containing a plurality of calibration control registers; and
   a current cell array receiving control signals from said dump control register module and said calibration control register module, wherein individual dump control and calibration control registers cooperate together to place individual ones of a plurality of current cells of said current cell array in a redundant calibration mode during a conversion operation of the digital-to-analog converter.

2. The digital-to-analog converter as recited in claim 1, further comprising a data selector array, coupled to said bit counter, selecting individual ones of the plurality of current cells in said current cell array for supplying output current during a conversion operation of the digital-to-analog converter.

3. The digital-to-analog converter as recited in claim 2, further comprising an output selection register module, coupled to said data selector array, wherein said output selection register module issues a plurality of output selection signals to control respective ones of the plurality of current cells in said cell array that are supplying current during a conversion operation of the digital-to-analog converter.

4. The digital-to-analog converter as recited in claim 1, wherein the plurality of current cells in said current cell array have the same cell structure; and wherein individual dump control and calibration control registers cooperate together to place only one of the plurality of current cells of said current cell array in a redundant calibration mode during a conversion operation of the digital-to-analog converter.

5. The digital-to-analog converter as recited in claim 1, wherein each of the plurality of current cells in said current cell array can be a redundant cell supplying current for another one of the plurality of current cells that is in the calibration mode.

6. The digital-to-analog converter as recited in claim 1, wherein the digital-to-analog converter is a 4-bit digital-to-analog converter having 16 current cells.

7. The digital-to-analog converter as recited in claim 1, the plurality of current cells in said current cell array are grouped together into a plurality of different current cell groups based on different cell structures; and wherein a different redundant cell is provided for each one of the plurality of different current cell groups.

8. A method of operating an analog-to-digital converter having a plurality of cells comprising:

converting a first sample of an analog signal to a first digital value using a first plurality of cells of the converter during a first time period;

dumping an output current of a selected one of the plurality of cells of the converter during a first portion of the first time period, wherein the first plurality of converter cells are exclusive of the selected one cell;

calibrating the selected one cell during a second portion of the first time period;

warming up the selected one cell during a third portion of the first time period; and converting a second portion of the analog signal to a second digital value using a second plurality of cells of the converter during a second time period, wherein the second plurality of converter cells includes the selected one cell;

wherein said dumping the output current of the selected one cell comprises:
connecting a drain of a transistor of the selected one cell to a source of ground potential.

9. A method of operating an analog-to-digital converter having a plurality of cells comprising:

converting a first sample of an analog signal to a first digital value using a first plurality of cells of the converter during a first time period;

dumping an output current of a selected one of the plurality of cells of the converter during a first portion of the first time period, wherein the first plurality of converter cells are exclusive of the selected one cell;

calibrating the selected one cell during a second portion of the first time period;

warming up the selected one cell during a third portion of the first time period; and converting a second portion of the analog signal to a second digital value using a second plurality of cells of the converter during a second time period, wherein the second plurality of converter cells includes the selected one cell;

wherein said warming up the selected one cell comprises:
connecting a drain of a transistor of the selected one cell to a source of ground potential.

* * * * *

UNITED STATES PATENT AND TRADEMARK OFFICE
CERTIFICATE OF CORRECTION

PATENT NO.     : 6,563,444 B2
DATED          : May 13, 2003
INVENTOR(S)    : Weibiao Zhang et al.

It is certified that error appears in the above-identified patent and that said Letters Patent is hereby corrected as shown below:

<u>Column 5,</u>
Line 27, reads "cell1," should read -- $cell_i$, --.

Signed and Sealed this

Twenty-second Day of July, 2003

JAMES E. ROGAN
*Director of the United States Patent and Trademark Office*